(12) United States Patent
Ebihara

(10) Patent No.: US 8,809,882 B2
(45) Date of Patent: Aug. 19, 2014

(54) LIGHT EMITTING ELEMENT, ILLUMINATION DEVICE, AND DISPLAY APPARATUS

(75) Inventor: Yohei Ebihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 363 days.

(21) Appl. No.: 13/406,057

(22) Filed: Feb. 27, 2012

(65) Prior Publication Data

US 2012/0248474 A1 Oct. 4, 2012

(30) Foreign Application Priority Data

Mar. 28, 2011 (JP) ................................. 2011-069585

(51) Int. Cl.
*H01L 33/08* (2010.01)
*H01L 33/60* (2010.01)
(52) U.S. Cl.
USPC ........... 257/89; 257/98; 257/88; 257/E33.072
(58) Field of Classification Search
USPC .......................................... 257/89; 313/114
See application file for complete search history.

(56) References Cited

U.S. PATENT DOCUMENTS

| 2011/0186878 A1* | 8/2011 | Fukuda et al. | ................... | 257/89 |
| 2011/0187259 A1* | 8/2011 | Fukuda et al. | ................. | 313/114 |
| 2011/0187260 A1* | 8/2011 | Fukuda et al. | ................. | 313/114 |
| 2011/0187261 A1* | 8/2011 | Fukuda et al. | ................. | 313/114 |

FOREIGN PATENT DOCUMENTS

| JP | 2000-243573 | 9/2000 |
| JP | 2002-289358 | 10/2002 |
| JP | 3508741 | 1/2004 |
| JP | 2004-079421 | 3/2004 |
| JP | 2006-173550 | 6/2006 |
| JP | 2006-244712 | 9/2006 |
| JP | 2006-244713 | 9/2006 |
| JP | 2008-511100 | 4/2008 |
| JP | 2008-518400 | 5/2008 |
| WO | WO-01/39554 | 5/2001 |

\* cited by examiner

*Primary Examiner* — Zandra Smith
*Assistant Examiner* — Lawrence Tynes, Jr.
(74) *Attorney, Agent, or Firm* — Rader, Fishman & Grauer PLLC

(57) ABSTRACT

A light emitting element has an organic layer that sequentially includes a first emission layer and a second emission layer, a first reflection interface, and a second reflection interface, wherein, if the optical distance between the first reflection interface and the emission center of a first emission layer is L11, the optical distance between the first reflection interface and the emission center of a second emission layer is L21, the optical distance between the emission center of the first emission layer and the second reflection interface is L12, the optical distance between the emission center of the second emission layer and the second reflection interface is L22, a central wavelength of an emission spectrum of the first emission layer is λ1, and a central wavelength of an emission spectrum of the second emission layer is λ2, the optical distances L11, L21, L12 and L22 satisfy predetermined expressions.

14 Claims, 9 Drawing Sheets

LIGHT EMITTING ELEMENT, ILLUMINATION DEVICE, AND DISPLAY APPARATUS

BACKGROUND

The present disclosure relates to a light emitting element, an illumination device, and a display apparatus, and more particularly to a light emitting element using electroluminescence of an organic material, an illumination device and a display apparatus using the light emitting element.

A light emitting element (hereinafter, referred to as an "organic EL element") using electroluminescence of an organic material has attracted attention as a light emitting element which can emit light with high luminance through low voltage DC driving and has been actively researched and developed. The organic EL element generally has a structure where an organic layer including an emission layer having a thickness of about several tens to several hundreds of nm is interposed between a reflective electrode and a transmissive electrode. In such an organic EL element, light beams emitted from the emission layer interfere with each other inside the element structure, and are extracted to outside. In the related art, an attempt for improving emission efficiency of the organic EL element using the interference has been made.

Japanese Unexamined Patent Application Publication No. 2002-289358 has proposed a method in which the emission efficiency is increased by setting a distance between the emission position and the reflective layer such that light of an emission wavelength becomes resonant by the use of the interference between light generated in the direction of the transmissive electrode direction from the emission layer and light generated in the direction of the reflective electrode.

Japanese Unexamined Patent Application Publication No. 2000-243573 prescribes both the distance from the emission position to the reflective electrode and the distance from the emission position to the interface between the transmissive electrode and the substrate, in consideration of light reflection from the interface between the transmissive electrode and the substrate.

In Pamphlet of International Publication WO. 01/039554, the emission efficiency is increased by setting the thickness of a layer between the transmissive electrode and the reflective electrode such that light of a desired wavelength becomes resonant by the use of interference occurring due to multiple reflections of light between the transmissive electrode and the reflective electrode.

The specification of Japanese Patent No. 3508741 has proposed a method in which an attenuation balance of three colors, red (R), green (G), and blue (B) is controlled by controlling the thickness of the organic layer, as a method of improving a viewing angle characteristic of the white chromaticity points in a display apparatus where light emitting elements are combined so as to increase the emission efficiency using a resonator structure.

However, in the techniques in the related art, in the organic EL element using the interference of the emitted light in order to increase the emission efficiency, if the bandwidth of the interference filter of the extracted light h is reduced, a wavelength of the light h is large and shifted when the emission surface is viewed from the tilt direction, thereby reducing emission intensity, which leads to an increase in viewing angle dependency of the emission characteristics.

In contrast, Japanese Unexamined Patent Application Publication No. 2006-244713 has proposed a method in which an emission phase by the reflective layer is set to have a reverse phase to a central wavelength in the perfect reflective surface side and the exit side in the organic EL element having a narrow monochromatic spectrum of a half value width, thereby suppressing color variations due to the viewing angle.

In addition, since the interference occurs inside of the element even in the organic light emitting element having white emission layers which are sequentially laminated, in order to efficiently extract white emission having a wide wavelength component, the emission position is close to the reflective layer, particularly, is close at a distance of 80 nm or less. If the emission position is distant from the reflective electrode layer and thus the distance therebetween is increased, it is difficult to obtain white emission having a wide spectrum.

Japanese Unexamined Patent Application Publication No. 2004-79421 discloses a method in which the distance from the emission position to the reflective layer and the distance from the emission position to the interface between the transmissive electrode and an external layer are prescribed, and thereby it is possible to obtain a light emitting element which has good efficiency and white chromaticity.

Japanese Unexamined Patent Application Publication No. 2006-244712 has reported that favorable white chromaticity points can be obtained by incorporating reverse-phase interference in the same manner as Japanese Unexamined Patent Application Publication No. 2006-244713. However, since phase cancellation is not performed in a wide wavelength band, suppression of variations in a color such as a single color due to the viewing angle is not disclosed in the same manner as Japanese Unexamined Patent Application Publication No. 2006-244713.

On the other hand, a technique has been used in which, in order to increase emission efficiency and improve emission life, the organic layer is configured to have a laminate (a so-called tandem structure) where the emission layers are connected in series to each other by laminating a plurality of emission layers via an intermediate layer (for example, refer to Japanese Unexamined Patent Application Publication No. 2006-173550, Japanese Unexamined Patent Application Publication (Translation of PCT Application) No. 2008-511100, and Japanese Unexamined Patent Application Publication (Translation of PCT Application) No. 2008-518400). In this kind of emission layer, it is possible to laminate any number of emission layers. In addition to an increase in efficiency by laminating layers generating spectra of the same wavelength, it is possible to adjust colors by laminating layers generating spectra of the different wavelengths. For example, by laminating a blue emission layer generating blue and laminating a yellow emission layer generating yellow, white light can be generated as composite light thereof.

However, in a case where the above-described tandem structure is formed, it is difficult to form all the distances from the respective emission positions to the reflective layer so as to be equal to or less than 80 nm, and since the viewing angle dependency of luminance and colors is much increased, light distribution characteristics as an illumination device or display characteristics as a display apparatus are considerably deteriorated.

SUMMARY

It is desirable to provide a light emitting element which can favorably extract light in a wide wavelength band even in a structure where emission layers are laminated in a plurality, and greatly reduce viewing angle dependency of luminance and colors with respect to light of a combination color of a plurality of colors.

It is further desirable to provide an illumination device which has small angle dependency and favorable light distribution characteristics. It is still further desirable to provide a display apparatus which has small viewing angle dependency and high image quality.

According to an embodiment of the present disclosure, there is provided a light emitting element including an organic layer that sequentially includes a first emission layer and a second emission layer which are interposed between a first electrode and a second electrode, and emit light of a single color or two or more different colors, at positions spaced apart from each other in the direction of the second electrode from the first electrode; a first reflection interface that is provided on the first electrode side, and reflects light emitted from the first emission layer and the second emission layer so as to be output from the second electrode side; and a second reflection interface that is provided on the second electrode side, wherein, if the optical distance between the first reflection interface and the emission center of the first emission layer is L11, the optical distance between the first reflection interface and the emission center of the second emission layer is L21, the optical distance between the emission center of the first emission layer and the second reflection interface is L12, optical distance between the emission center of the second emission layer and the second reflection interface is L22, a central wavelength of an emission spectrum of the first emission layer is λ1, and a central wavelength of an emission spectrum of the second emission layer is λ2, the optical distances L11, L21, L12 and L22 satisfy all the following expressions (1) to (8).

$$2L11/\lambda11 + \phi1/2\pi = 0 \quad (1)$$

$$2L21/\lambda21 + \phi1/2\pi = n \text{(where } n \geq 1) \quad (2)$$

$$\lambda1 < \lambda11 < \lambda1 + 200 \quad (3)$$

$$\lambda2 - 40 < \lambda21 < \lambda2 + 40 \quad (4)$$

$$2L12/\lambda12 + \phi2/2\pi = m' \quad (5)$$

$$2L22/\lambda22 + \phi2/2\pi = n' + 1/2 \quad (6)$$

$$\lambda1 - 100 < \lambda12 < \lambda1 \quad (7)$$

$$\lambda2 - 15 < \lambda22 < \lambda2 + 15 \quad (8)$$

where n, m' and n' are integers, the unit of each of λ1, λ2, λ11, λ21, λ12, and λ22 is nm, φ1 indicates a phase variation when light of each wavelength is reflected by the first reflection interface, and φ2 indicates a phase variation when light of each wavelength is reflected by the second reflection interface.

According to another embodiment of the present disclosure, there is provided an illumination device having at least a light emitting element that includes an organic layer that sequentially includes a first emission layer and a second emission layer which are interposed between a first electrode and a second electrode, and emit light of a single color or two or more different colors, at positions spaced apart from each other in the direction of the second electrode from the first electrode; a first reflection interface that is provided on the first electrode side, and reflects light emitted from the first emission layer and the second emission layer so as to be output from the second electrode side; and a second reflection interface that is provided on the second electrode side, wherein, if the optical distance between the first reflection interface and the emission center of the first emission layer is L11, the optical distance between the first reflection interface and the emission center of the second emission layer is L21, the optical distance between the emission center of the first emission layer and the second reflection interface is L12, an optical distance between the emission center of the second emission layer and the second reflection interface is L22, a central wavelength of an emission spectrum of the first emission layer is λ1, and a central wavelength of an emission spectrum of the second emission layer is λ2, the optical distances L11, L21, L12 and L22 satisfy all the above-described expressions (1) to (8).

According to still another embodiment, there is provided a display apparatus having at least a light emitting element that includes an organic layer that sequentially includes a first emission layer and a second emission layer which are interposed between a first electrode and a second electrode, and emit light of a single color or two or more different colors, at positions spaced apart from each other in the direction of the second electrode from the first electrode; a first reflection interface that is provided on the first electrode side, and reflects light emitted from the first emission layer and the second emission layer so as to be output from the second electrode side; and a second reflection interface that is provided on the second electrode side, wherein, if the optical distance between the first reflection interface and the emission center of the first emission layer is L11, the optical distance between the first reflection interface and the emission center of the second emission layer is L21, the optical distance between the emission center of the first emission layer and the second reflection interface is L12, an optical distance between the emission center of the second emission layer and the second reflection interface is L22, a central wavelength of an emission spectrum of the first emission layer is λ1, and a central wavelength of an emission spectrum of the second emission layer is λ2, the optical distances L11, L21, L12 and L22 satisfy all the above-described expressions (1) to (8).

The emission center of each of the first emission layer and the second emission layer means a surface where the peak of the emission intensity distribution in the thickness direction is located, and is typically a surface which equally divides the thickness into two. The emission center is typically a surface which equally divides the thickness into two in a case where the emission centers are considered to be the same as each other since the thickness of the layer emitting light of each color is sufficiently small when the first emission layer or the second emission layer emits light of two or more different colors.

The expression (1) is an expression where the optical distance between the first reflection interface and the emission center of the first emission layer is set such that light of a wavelength longer than the central wavelength of the emission spectrum of the first emission layer is strengthened due to interference between the first reflection interface and the emission center of the first emission layer. The expression (2) is an expression where the optical distance between the first reflection interface and the emission center of the second emission layer is set such that light of a wavelength around the central wavelength of the emission spectrum of the second emission layer is strengthened due to interference between the first reflection interface and the emission center of the second emission layer. The expressions (3) and (4) are conditions for achieving a wide band of the interference wavelength in this case. The expression (5) is a condition that, in relation to light from the first emission layer, reflection of light by the second reflection interface strengthens light shorter than the central wavelength of the emission spectrum of the first emission layer. The expression (6) is a condition that, in relation to light from the second emission layer, reflection of light by the second reflection interface weakens light around the central wavelength of the emission spectrum of the second emission layer. λ11, λ21, λ12, and λ22 of the expressions (1), (2), (5) and (6) are obtained from λ1 and λ2 using the expressions (3), (4), (7) and (8).

Here, n, m', and n' are selected as necessary. In order to increase an amount of light extracted from the light emitting element, n≤5 is preferable, and n=1 is the most preferable.

The first emission layer and the second emission layer emit light of visible light regions with different wavelengths, and the present disclosure is not limited thereto.

According to the light emitting element, a peak of a spectral transmittance curve of an interference filter may be substantially flat. Particularly, the light emitting element is configured so as to satisfy all the expressions (1) to (8), a decrease in luminance when a viewing angle is 45 degrees may be 30% or less of luminance when the viewing angle is 0 degrees, and chromaticity shift may be Δuv≤0.015.

The light emitting element may be of an upper surface emission type or of a lower surface emission type. In the upper surface emission type light emitting element, the first electrode, the organic layer, and the second electrode may be sequentially laminated on a substrate. In the lower surface emission type light emitting element, the second electrode, the organic layer, and the first electrode may be sequentially laminated on a substrate. The substrate of the upper surface emission type light emitting element may be opaque or transparent, and may be selected as necessary. The surface of the lower surface emission type light emitting element is transparent such that light output from the second electrode is extracted to outside.

The light emitting element may further include a reflective layer that is used to maintain the flatness of the peak of the spectral transmittance curve of the interference filter of the light emitting element in a case where the emission centers of the emission layers emitting light of two or more different colors are not considered to be the same as each other in the first emission layer and the second emission layer.

As necessary, one or a plurality of reflection interfaces may be provided in addition to the first reflection interface and the second reflection interface. In addition, as necessary, at least one of the first reflection interface, the second reflection interface, and the third reflection interface may be divided into a plurality of reflection interfaces. With this, a wavelength band where light reflection by the first reflection interface and light reflection by the second reflection interface are strengthened or weakened is expanded, and thus the flat part of the peak of the spectral transmittance curve of the interference filter is expanded for each emission region, thereby improving viewing angle characteristics.

In the light emitting element, in terms of improvement in reliability, employed configurations, or the like, a reflective layer is further formed, and, accordingly, a reflection interface may be further formed. In this case, after up to the second reflection interface which is necessary for an optical operation is formed, a layer having a thickness of 1 μm or more is formed thereon, and thereby it is possible to nearly ignore an influence of subsequent interference. A material of the outside of the second reflection interface at this time may use any material, and is appropriately selected according to a form of the light emitting element. Specifically, the outside of the second reflection interface is formed by one or two or more of a transparent electrode layer, a transparent insulating layer, a resin layer, a glass layer, or an air layer, which has a thickness of 1 μm or more, and the present disclosure is not limited thereto.

The illumination device and the display apparatus according to the embodiments of the present disclosure may have an existing configuration in the related art, and are appropriately configured according to such a use or function. As a typical example, the display apparatus includes a driving substrate that is provided with an active element (thin film transistor) for supplying a display signal corresponding to a display pixel to the light emitting element and a sealing substrate that is provided so as to be opposite to the driving substrate. The light emitting element is disposed between the driving substrate and the sealing substrate. The display apparatus may be a white display apparatus, black and white display apparatus, or a color display apparatus. In the color display apparatus, typically, a color filter which transmits light output from the second electrode side therethrough is provided on the substrate of the second electrode side the light emitting element of the driving substrate and the sealing substrate.

According to the embodiments of the present disclosure, it is possible to provide a light emitting element which can favorably extract light in a wide wavelength band even in a structure where emission layers are laminated in a plurality, and greatly reduce viewing angle dependency of luminance and colors with respect to light of a combination color of a plurality of colors.

Further, according to the embodiments of the present disclosure, it is possible to provide an illumination device which has small angle dependency and favorable light distribution characteristics, and a display apparatus which has small viewing angle dependency and high image quality.

DETAILED DESCRIPTION OF EMBODIMENTS

Hereinafter, embodiments of the present disclosure will be described. In addition, the description will be made in the following order.
1. FIRST EMBODIMENT (ORGANIC EL ELEMENT)
2. SECOND EMBODIMENT (ORGANIC EL ELEMENT)
3. THIRD EMBODIMENT (ORGANIC EL ILLUMINATION DEVICE)
4. FOURTH EMBODIMENT (ORGANIC EL DISPLAY APPARATUS)
1. First Embodiment
Organic EL Element FIG. 1 shows an organic EL element according to a first embodiment.

Figure 1:
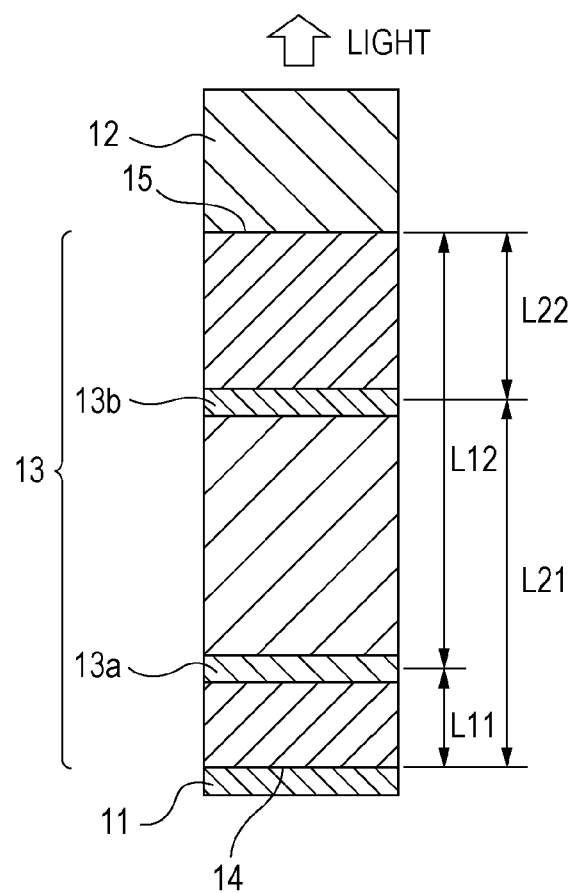
FIG. 1 is a cross-sectional view illustrating an organic EL element according to a first embodiment.

As shown in FIG. 1, in the organic EL element, an organic layer 13 which sequentially includes a first emission layer 13a and a second emission layer 13b which are spaced apart from each other in the direction of a second electrode 12 from a first electrode 11, is interposed between the first electrode 11 and the second electrode 12. A hole injection layer, a hole transport layer, an electron transport layer, an electron injection layer, and the like are provided in the emission layer 13 at the upper and lower parts of the first emission layer 13a and the upper and lower parts of the second emission layer 13b as necessary, in the same manner as an organic EL element in the related art. In this case, the second electrode 12 is a transparent electrode which transmits light which is intended to be extracted from the organic EL element, typically visible light, therethrough, and light is output from the second electrode 12 side. The first emission layer 13a and the second emission layer 13b emit single-color light or light of two or more different colors where a difference in wavelengths is within, for example, 120 nm. Emission wavelengths of the first emission layer 13a and the second emission layer 13b are appropriately selected according to colors of light beams which are intended to be emitted from the organic EL element. Generally, the emission wavelengths of the first emission layer 13a and the second emission layer 13b are preferably sequentially shortened from the first electrode 11 to the second electrode 12, and the present disclosure is not limited thereto. Here, it is assumed that both the first emission layer 13a and the second emission layer 13b emit single color light. For example, in a case where this organic EL element is used as a white light emitting element, yellow light is made to be emitted from the first emission layer 13a, and blue light is made to be emitted from the second emission layer 13b. The first electrode 11, the second electrode 12, the organic layer 13, the first emission layer 13a, and the second emission layer 13b are made of materials in the related art, and are selected as necessary.

The refractive index of the organic layer 13 is different from the refractive index of the first electrode 11, and this difference in the refractive index forms a first reflection interface 14 between the first electrode 11 and the organic layer 13. The first reflection interface 14 may be provided at a position spaced apart from the first electrode 11 as necessary. The first reflection interface 14 reflects light emitted from the first emission layer 13a and the second emission layer 13b and makes the light to be output from the second electrode 12 side. The refractive index of the organic layer 13 is different from the refractive index of the second electrode 12, and the difference in the refractive index forms a second reflection interface 15 between the organic layer 13 and the second electrode 12.

In FIG. 1, optical distances L11, L21, L12, and L22 are written in corresponding parts. In the organic EL element, the optical distances L11, L21, L12, and L22 are all set so as to satisfy the above-described expressions (1) to (8).

Detailed description will be made by exemplifying a case where the organic EL element is a white light emitting element.

In the white light emitting organic EL element, the first emission layer 13a emits yellow light, the second emission layer 13b emits blue light, and white light is extracted as a combination color of the colors. A central wavelength $\lambda 1$ of the emission spectrum of the first emission layer 13a is, for example, 560 nm, and a central wavelength $\lambda 2$ of the emission spectrum of the second emission layer 13b is, for example, 450 nm.

The optical distance L11 between the first reflection interface 14 and the emission center of the first emission layer 13a and the optical distance L21 between the first reflection interface 14 and the emission center of the second emission layer 13b are set so as to satisfy the expressions (1) to (4). The optical distance L11 is set such that light of a wavelength longer than the central wavelength $\lambda 1$ of the emission spectrum of the first emission layer 13a is strengthened due to interference between the first reflection interface 14 and the emission center of the first emission layer 13a. The optical distance L21 is set such that light of a wavelength around the central wavelength $\lambda 2$ of the emission spectrum of the second emission layer 13b is strengthened due to interference between the first reflection interface 14 and the emission center of the second emission layer 13b.

The phase variation $\phi 1$ when light of each wavelength is reflected by the first reflection interface 14 is calculated as follows. That is to say, $\phi 1$ is calculated from the expression $\phi 1 = \tan^{-1}\{2n_0 k/(n^2+k^2-n_0^2))\}$ using n and k of the complex refractive index $N = n - jk$ (n: refractive index, and k: extinction coefficient) of the first electrode 11 and the refractive index $n_0$ of the organic layer 13 adjacent to the first electrode 11 (for example, refer to Principles of Optics, Max Born and Emil Wolf, 1974 (PERGAMON PRESS), or the like). The refractive index of the organic layer 13 can be measured using a spectroscopic ellipsometry measurement device.

A detailed example of the calculation of $\phi 1$ will be described below. If the first electrode 11 is made of, for example, an aluminum (Al) alloy, n=0.570 and k=4.725 for light of the wavelength 460 nm (corresponding to the central wavelength $\lambda 2$ of the emission spectrum of the second emission layer 13b), and n=0.908 and k=5.927 for light of the wavelength 550 nm (corresponding to the central wavelength $\lambda 1$ of the emission spectrum of the first emission layer 13a). If the refractive index $n_0$=1.75 of the organic layer 13, $\phi 1$=−2.511 radian can be obtained for the light of the wavelength 460 nm, and $\phi 1$=−2.618 radian can be obtained for the light of the wavelength 550 nm, in consideration of $-2\pi < \phi 1 \leq 0$. In addition, the phase variation $\phi 2$ when light of each wavelength is reflected by the second reflection interface 15 can be obtained in this way.

Next, $\lambda 11$ and $\lambda 21$ (the unit thereof is nm) are obtained as follows from, for example, L11=154 nm, L21=305 nm, the expressions (1) and (2).

$$2L11/\lambda 11+\phi 1/2\pi=0 \quad (1)'$$

$$2L21/\lambda 21+\phi 1/2\pi=1 \quad (2)'$$

$$\text{Here, } \lambda 1=560<\lambda 11=739<\lambda 1+200=760 \text{nm} \quad (3)'$$

$$\lambda 2-40=410<\lambda 21=435<\lambda 2+40=490 \text{nm} \quad (4)'$$

They satisfy the expressions (1) to (4).

Figure 2:
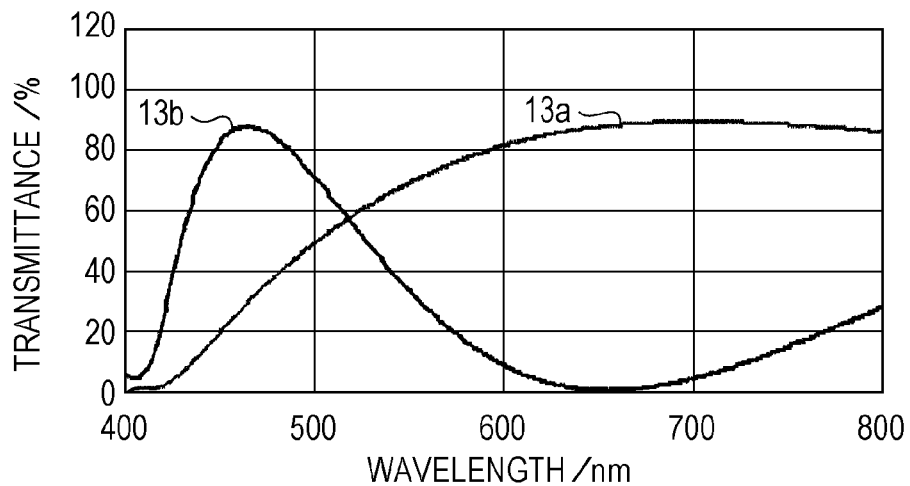
FIG. 2 is a schematic diagram illustrating a spectral transmittance curve of the interference filter by the first reflection interface in the organic EL element according to the first embodiment.

Since the interference filter state by the first reflection interface 14 with respect to the first emission layer 13a and the second emission layer 13b at this time lies in a condition of being strengthened, the spectral transmittance curve has peak parts and thus generates wavelength selectivity in extracting light as shown in FIG. 2. As a result, emission spectrum different from in the internal emission is observed. In this case, the transmittance is reduced around the wavelength 550 nm, and thus white light may not be extracted with balance. In addition, a flat part is not obtained in the spectral transmittance curve, and thus the viewing angle characteristic represents notable variations in luminance and colors. Therefore, the second reflection interface 15 is necessary.

Next, the second reflection interface 15 is formed between the organic layer 13 with the refractive index $n_0=1.75$ and the second electrode 12 with the refractive index (for example, the refractive index 1.6) different from that of the organic layer 13. As a material of the second electrode 12 with the refractive index 1.6, for example, indium tin oxide (ITO) may be used.

The optical distance L12 between the emission center of the first emission layer 13a and the second reflection interface 15 and the optical distance L22 between the emission center of the second emission layer 13b and the second reflection interface 15 are set so as to satisfy the expressions (5) to (8). The reflection of light by the second reflection interface 15 gives conditions that light from the first emission layer 13a is strengthened on a wavelength side shorter than the central wavelength $\lambda 1$ and light from the second emission layer 13b is weakened around the central wavelength $\lambda 2$. For example, if L12=483 nm, and L22=333 nm, in this case, since $\phi 2=0$ in the second reflection interface 15, $\lambda 12$ and $\lambda 22$ (the unit thereof is nm) are obtained as follows.

$$2L12/\lambda 12=2 \quad (5)'$$

$$2L22/\lambda 22=1+1/2 \quad (6)'$$

$$\lambda 1-100=460 \text{ nm}<\lambda 12=483 \text{ nm}<\lambda 1-50=510 \text{ nm} \quad (7)'$$

$$\lambda 2-15=435 \text{ nm}<\lambda 22=444 \text{ nm}<\lambda 2+15=465 \text{ nm} \quad (8)'$$

The conditions of the expressions (5) to (8) are satisfied.

As described above, the conditions of the expressions (1) to (8) are all satisfied.

Figure 3:
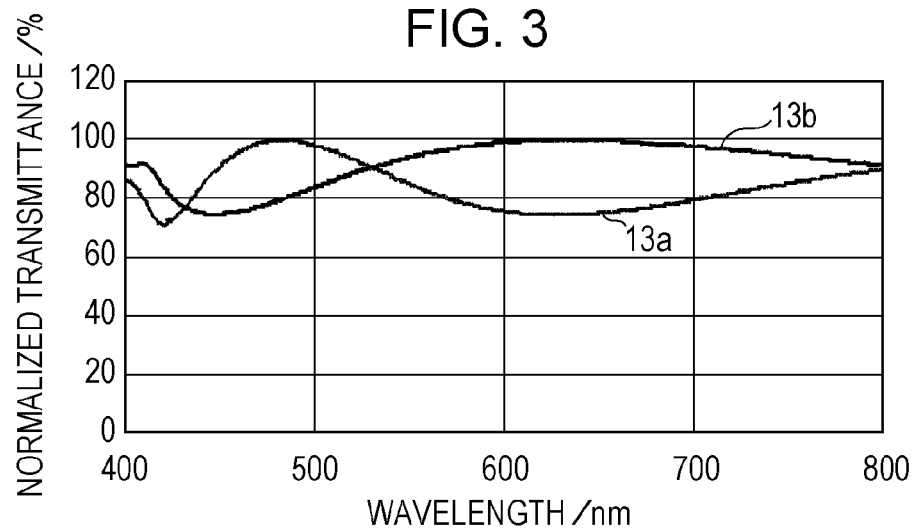
FIG. 3 is a schematic diagram illustrating a spectral transmittance curve of the interference filter by the second reflection interface in the organic EL element according to the first embodiment.

FIG. 3 shows a spectral transmittance curve of the interference filter by the second reflection interface 15. As shown in FIG. 3, in this case, the blue region forms a condition that the light is weakened around the emission center. In addition, the yellow region forms a condition that the light is strengthened in the short wavelength region, and is weakened in the long wavelength region.

Figure 4:
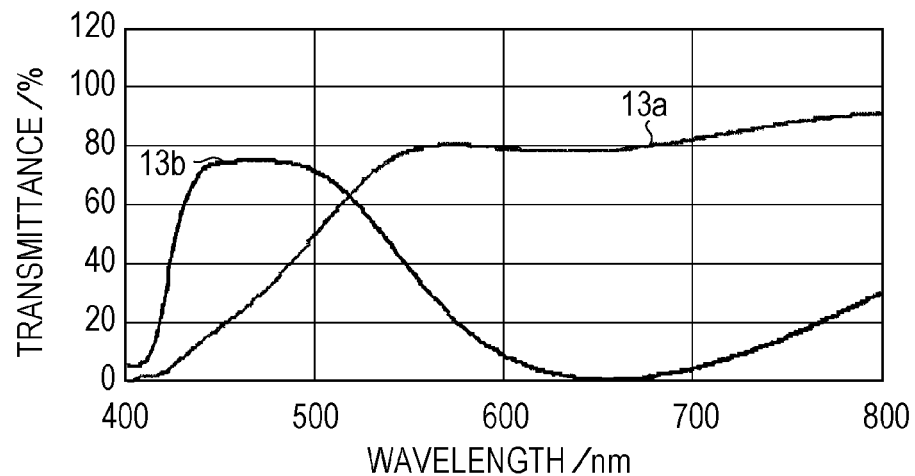
FIG. 4 is a schematic diagram illustrating a spectral transmittance curve of the composite interference filter by the first and second reflection interfaces in the organic EL element according to the first embodiment.
Figure 5:
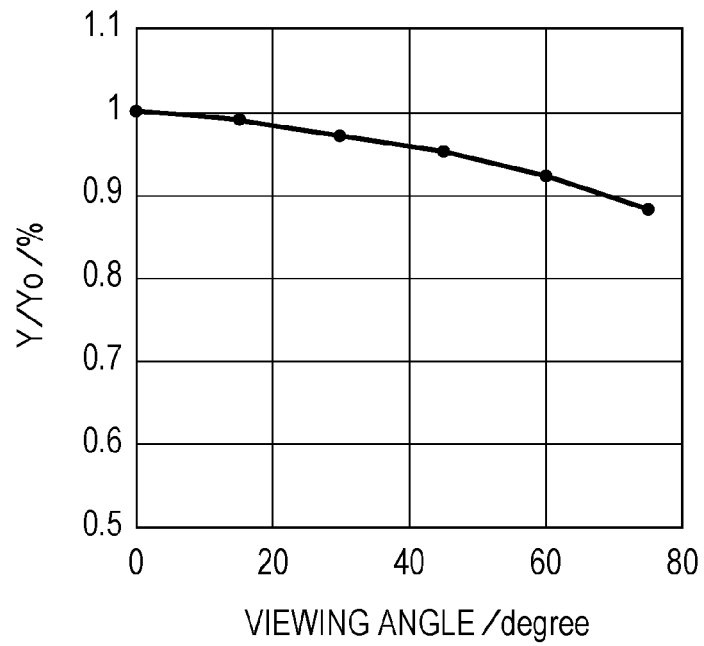
FIG. 5 is a schematic diagram illustrating a viewing angle characteristic of luminance in the organic EL element according to the first embodiment.
Figure 6:
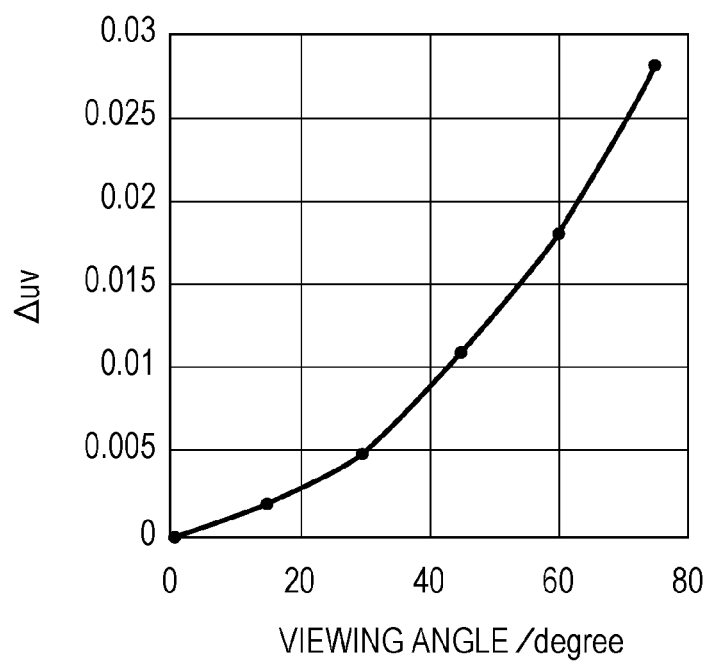
FIG. 6 is a schematic diagram illustrating a viewing angle characteristic of chromaticity in the organic EL element according to the first embodiment.

FIG. 4 shows a spectral transmittance curve of the interference filter effects achieved by the second reflection interface 15 in addition to the first reflection interface 14. It can be seen from FIG. 4 that the nearly flat interference filters are formed in the blue region and the yellow region of the spectral transmittance curve. In addition, viewing angle characteristics of luminance and chromaticity are shown in FIGS. 5 and 6 in this state. As is clear from FIGS. 5 and 6, the viewing angle of 45 degrees maintains 85% or more of the luminance at the viewing angle of 0 degrees, and the chromaticity shift of $\Delta uv \leq 0.015$ is realized.

Here, determination methods of the optical distances L11, L21, L12 and L22 will be described again.

First, determination methods of L11 and L21 will be described.

As an example, it will be made a description of a case where the first emission layer 13a emits yellow light (the central wavelength $\lambda 1=560$ nm), the second emission layer 13b emits blue light (the central wavelength $\lambda 2=460$ nm), and the organic EL element is a white light emitting element.

Light beams traveling to the second reflection interface 15 from the first emission layer 13a and the second emission layer 13b are obtained by superposition of light beams which directly travel to the second reflection interface 15 from the first emission layer 13a and the second emission layer 13b, and light beams which travel to the first reflection interface 14 from the first emission layer 13a and the second emission layer 13b and then travel to the second reflection interface 15 after being reflected by the first reflection interface 14.

An intensity of the superposed light beams becomes a function of the optical distances L11 and L21 in proportion to the following expressions (a) and (b) in consideration of the phase shift in the first reflection interface 14 and the second reflection interface 15.

$$\{1+\cos(4\pi \times L11/\lambda 1+\phi 1)\}^2+\{\sin(4\pi \times L11/\lambda 1+\phi 1)\}^2 \quad (a)$$

$$\{1+\cos(4\pi \times L21/\lambda 2+\phi 1)\}^2+\{\sin(4\pi \times L21/\lambda 1+\phi 1)\}^2 \quad (b)$$

Here, a method of obtaining the phase shift $\phi 1$ when light of each wavelength is reflected by the first reflection interface 14 is the same as described above, and, in the above-described example, $\phi 1=-2.511$ radian at 460 nm and $\phi 1=-2.618$ radian at 560 nm can be obtained.

Figure 7:
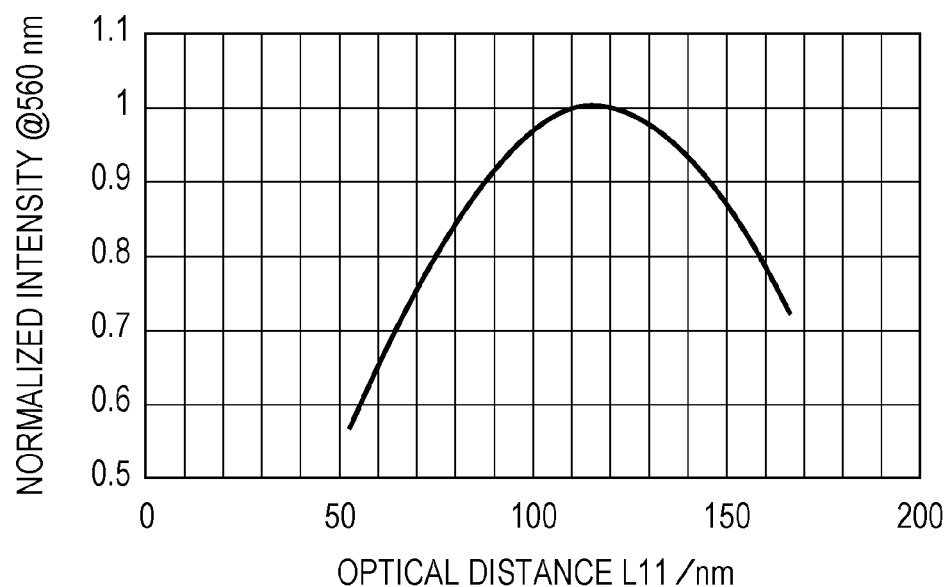
FIG. 7 is a schematic diagram illustrating a relationship between the normalized intensity of yellow light emitted from the first emission layer and the optical distance L11.
Figure 8:
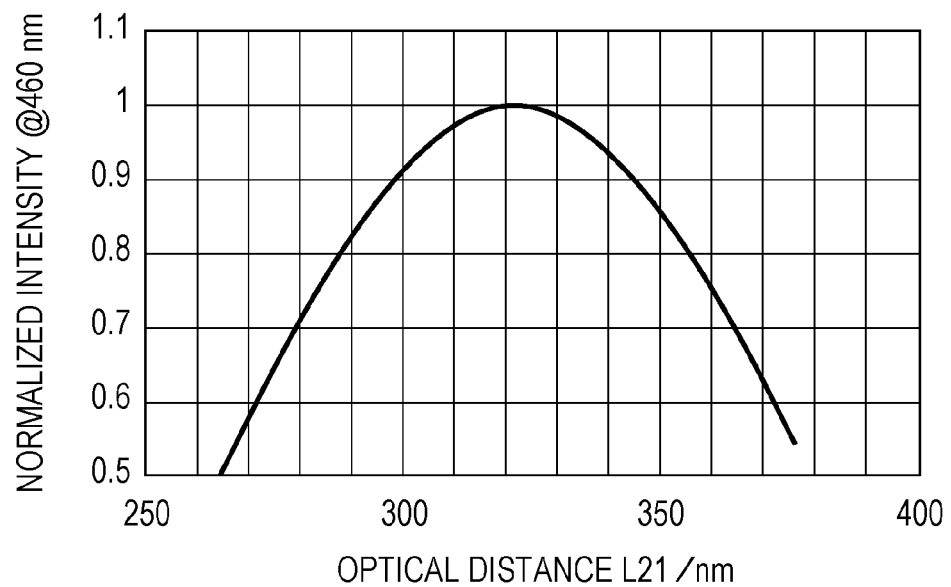
FIG. 8 is a schematic diagram illustrating a relationship between the normalized intensity of blue light emitted from the second emission layer and the optical distance L21.

FIG. 7 shows a relationship between light intensity (normalized intensity) at the wavelength 560 nm calculated using the expression (a) and the optical distance L11 in relation to the first emission layer 13a. In addition, FIG. 8 shows a relationship between light intensity (normalized intensity) at the wavelength 460 nm calculated using the expression (b) and the optical distance L21 in relation to the second emission layer 13b.

Positions at which the first emission layer 13a and the second emission layer 13b are provided are selected as positions satisfying the following conditions.

(i) The position at which the first emission layer 13a is provided, that is, the optical distance L11 is provided at a position where the normalized intensity is greater than 0.8 and the normalized light intensity is increased in the upper left part.

(ii) The position at which the second emission layer 13b is provided, that is, the optical distance L21 is provided at a position where the normalized intensity is greater than 0.8.

The condition (i) indicates a condition that light is strengthened at $\lambda 1$ and is further strengthened at long wavelength side around $\lambda 1$ in relation to L11. The condition (ii) indicates a condition that light is strengthened at $\lambda 2$ in relation to L21.

Application to calculation leads to 116<L11<158, and 288<L21<355. If they are rewritten in the form of inequality of $\lambda 11$ and $\lambda 21$ using the expressions (1) and (2), it gives $\lambda 1 < \lambda 11 < \lambda 1+203$ nm, and $\lambda 2-48$ nm $< \lambda 21 < \lambda 2+48$ nm. Thereby, L11 and L21 can be determined.

Next, determination methods of L12 and L22 will be described.

L11 and L21 are obtained from the expressions (1) to (4), and, for example, L11 is 130 nm, and L21 is 320 nm.

At this time, interference by the second reflection interface 15 is performed by superposition of light beams which directly travel to the second reflection interface 15 from the first emission layer 13a and the second emission layer 13b, and light beams which travel to the first reflection interface 14 from the first emission layer 13a and the second emission layer 13b and then travel to the second reflection interface 15 after being reflected by the first reflection interface 14. An intensity of the superposed light beams becomes a function of the optical distances L12 and L22 in proportion to the following expressions (c) and (d) in consideration of the phase shift in the first reflection interface 14 and the second reflection interface 15.

$$\{1+\cos(4\pi \times L12/\lambda 1+\phi 2)\}^2+\{\sin(4\pi \times L12/\lambda 1+\phi 2)\}^2 \quad (c)$$

$$\{1+\cos(4\pi 33\ L22/\lambda 2+\phi 2)\}^2+\{\sin(4\pi \times L22/\lambda 1+\phi 2)\}^2 \quad (d)$$

Here, it is necessary to calculate the phase shift $\phi 2$ when light of each wavelength is reflected by the second reflection interface 15.

If the second reflection interface 15 is formed as, for example, an interface between the organic layer 13 and the second electrode 12 made of a transparent electrode material, and $n_0=1.6$ and $k=0$ of the transparent electrode material are used in the visible light region, $\phi 2$ becomes 0.

Figure 9:
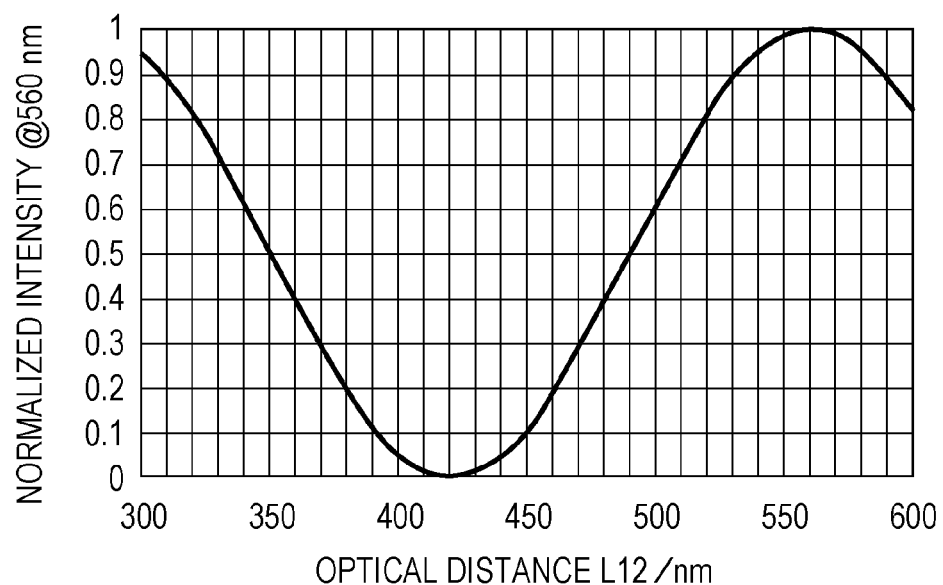
FIG. 9 is a schematic diagram illustrating a relationship between the normalized intensity of yellow light emitted from the first emission layer and the optical distance L12.
Figure 10:
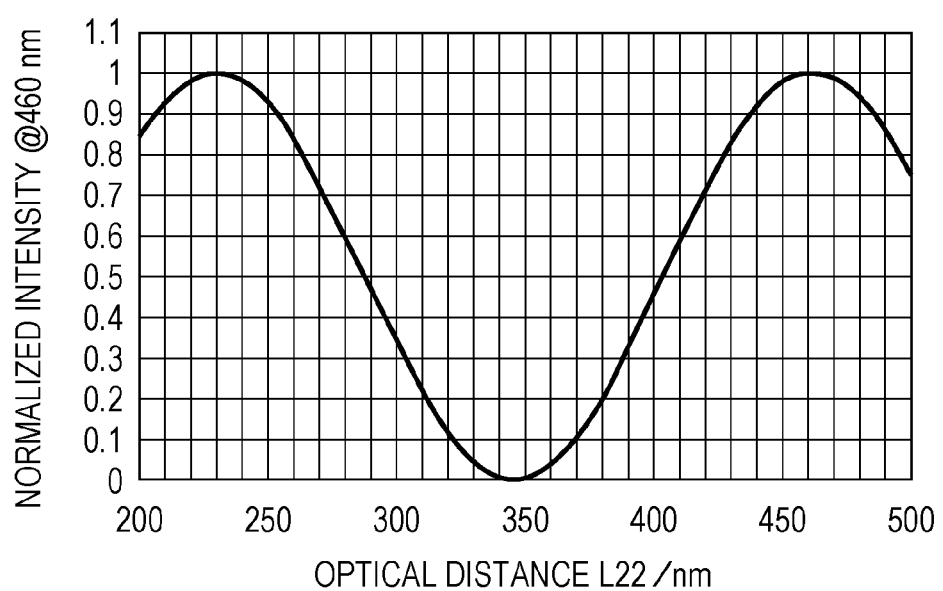
FIG. 10 is a schematic diagram illustrating a relationship between the normalized intensity of blue light emitted from the second emission layer and the optical distance L22.

FIG. 9 shows a relationship between light intensity (normalized intensity) at the wavelength 560 nm calculated using the expression (c) and the optical distance L12 in relation to the first emission layer 13a. In addition, FIG. 10 shows a relationship between light intensity (normalized intensity) at the wavelength 460 nm calculated using the expression (d) and the optical distance L22 in relation to the second emission layer 13b.

Positions at which the first emission layer 13a and the second emission layer 13b are provided are selected as positions satisfying the following conditions.

(iii) The position at which the first emission layer 13a is provided, that is, the optical distance L12 is provided at a position where the normalized intensity is increased in the upper right part.

(iv) The position at which the second emission layer 13b is provided, that is, the optical distance L22 is provided at a position where the normalized intensity is smaller than 0.1.

The condition (iii) indicates a condition that light is strengthened on the short wavelength side around $\lambda 1$ and is weakened at long wavelength side around $\lambda 1$, as compared with the normalized intensity at $\lambda 1$ in relation to L12. The condition (iv) indicates a condition that light is weakened at $\lambda 2$ in relation to L22.

Application to calculation leads to $420 < L12 < 560$, and $320 < L22 < 370$. If they are rewritten in the form of inequality of $\lambda 12$ and $\lambda 22$ using the expressions (5) and (6), it gives $\lambda 1-140$ nm $< \lambda 12 < \lambda 1$, and $\lambda 2-33$ nm $< \lambda 22 < \lambda 2+33$ nm.

The optical distances L12 and L22 satisfying the expressions together are values which are intended to be obtained. Here, the optical distances L12 and L22 have the following relationship.

$$L22=L12+L11-L21 \quad (e)$$

At this time, since L11=130 nm and L21=320 nm, there is an establishment of the relationship of L22=L12+130−320=L12−190 nm.

Figure 11:
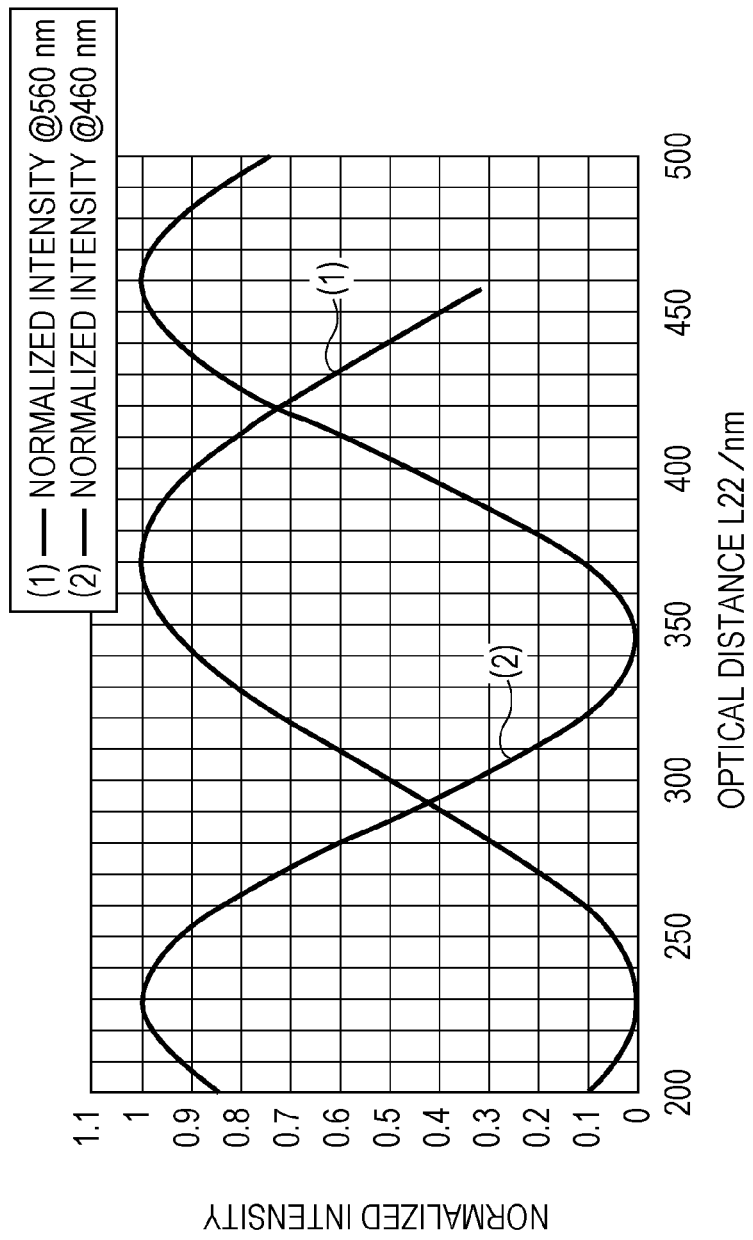
FIG. 11 is a schematic diagram illustrating a relationship between the normalized intensity of yellow light emitted from the first emission layer, the normalized intensity of blue light emitted from the second emission layer, and the optical distance L22.

Therefore, the normalized intensity which is expressed as a function of L22 using the expression (e) is shown in FIG. 11.

It is preferable to obtain L22 satisfying all the conditions. For example, L22 may be 340 nm.

All the numerical values of L11, L21, L12, and L22 can be determined through the above-described calculation procedures.

As described above, according to the first embodiment, the organic EL element is configured so as to satisfy all the expressions (1) to (8). As a result, in the organic EL element, the transmittance of the interference filter is high in the wide wavelength band, and light can be favorably extracted in the wide wavelength band. For this reason, according to the organic EL element, it is possible to implement a white light emitting element having a favorable color. In addition, it is possible to considerably reduce viewing angle dependency of luminance and colors in a single color or a combination color of two or more different colors. In addition, in the organic EL element, an emission color can be selected through design of the first emission layer 13a and the second emission layer 13b. In addition, the organic EL element has high transmittance of the interference filter and has thus low power consumption.

2. Second Embodiment

Organic EL Element

In the organic EL element according to the second embodiment, the second reflection interface 15 of the organic EL element according to the first embodiment is divided into two front and rear reflection interfaces, thereby expanding a wavelength band in the interference condition of the reverse phase shown in the expression (6). In other words, in the expression (6), if the second reflection interface 15 is divided into two reflection interfaces which are respectively spaced apart by $\Delta$, L22 becomes L22+$\Delta$ and L22−$\Delta$, and the a band of $\lambda 12$ where the expression (6) is established is expanded.

According to the second embodiment, in addition to the advantage which is the same as in the first embodiment, a wavelength band in the interference condition of the reverse phase shown in the expression (6) can be expanded, and it is possible to achieve an advantage in that the viewing angle characteristic of the organic EL element can be further improved.

Example 1

Example 1 corresponds to the first embodiment.

Figure 12:
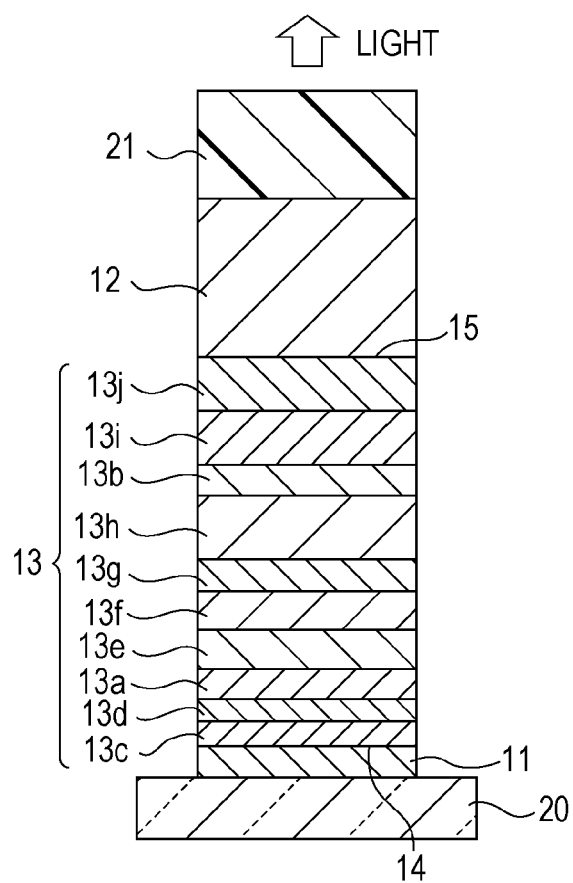
FIG. 12 is a cross-sectional view illustrating an upper surface emission type organic EL element according to Example 1.

FIG. 12 shows an organic EL element according to Example 1. The organic EL element is an upper surface emission type organic EL element. As shown in FIG. 12, in the organic EL element, a first electrode 11, an organic layer 13, and a second electrode 12 are sequentially laminated on a substrate 20 from the lower layer, and a passivation layer 21 is provided on the second electrode 12.

The substrate 20 is formed of, for example, a transparent glass substrate or a semiconductor substrate (for example, a silicon substrate), and may be flexible. The first electrode 11 is used as an anode electrode which is also used as a reflective layer, and, is made of a light reflection material such as, for example, aluminum (Al), an aluminum alloy, platinum (Pt), gold (Au), chrome (Cr), or tungsten (W). The thickness of the first electrode 11 is set to a range of 100 nm to 300 nm. The first electrode 11 may be a transparent electrode, and, in this case, it is preferable to provide a reflective layer made of a light reflection material such as, for example, Pt, Au, Cr, or W in order to form the first reflection interface 14 between the first electrode 11 and the substrate 20.

The organic layer 13 has a structure in which a hole injection layer 13c, a hole transport layer 13d, a first emission layer 13a, an electron transport layer 13e, an electron injection layer 13f, a connection layer 13g, a hole transport layer 13h, a second emission layer 13b, an electron transport layer 13i, and the electron injection layer 13j are sequentially laminated from the lower layer. The hole injection layer 13c is made of, for example, hexaazatriphenylene (HAT). The hole transport layer 13d is made of, for example, α-NPD[N,N'-di(1-naphthyl)-N,N'-diphenyl-[1,1'-biphenyl]-4,4'-diamine]. The first emission layer 13a is made of an emission material having a yellow light emitting color. As the emission material having the yellow light emitting color, a material where rubrene as a host material is doped with a pyrromethene complex may be used. The electron transport layer 13e is made of, for example, BCP(2,9-dimethyl-4,7-diphenyl-1,10-phenanthroline), or the like. The electron injection layer 13f is made of, for example, lithium fluoride (LiF). The connection layer 13g is made of, for example, Alq3(8-hydroxyquinoline aluminum) which is doped with Mg by 5%, hexaazatriphenylene (HAT), or the like. The hole transport layer 13h which is also used a hole injection layer is made of, for example, α-NPD. The second emission layer 13b is made of an emission material having a blue light emitting color. Specifically, ADN(9, 10-di(2-naphtyl)anthracene) is deposited as a host material, thereby forming a film of the film thickness 20 nm. At this time, ADN is doped with a diaminochrysene derivative which is a dopant material at a relative film thickness of 5%, and this film may be used as the blue light emitting layer. The electron transport layer 13i is made of, for example, BCP. The electron transport layer 13j is made of, for example, LiF.

As the thickness of each layer forming the organic layer 13, preferably, the hole injection layer 13c is set to a range of 1 to 20 nm, the hole transport layer 13d is set to a range of 15 to 100 nm, the first emission layer 13a and the second emission layer 13b respectively are set to a range of 5 to 50 nm, the electron injection layers 13f and 13j and the electron transport layers 13e and 13i are respectively set to 15 to 200 nm. The organic layer 13 and the thickness of each layer forming the organic layer 13 are set to such values where optical film thicknesses thereof enable the above-described operation.

The second reflection interface 15 is formed using a refractive index difference between the organic layer 13 and the second electrode 12. The second electrode 12 is made of ITO or an oxide of indium and zinc which is generally used as a transparent electrode material, and is used as a cathode electrode. The thickness of the second electrode 12 is set to a range of, for example, 30 to 3000 nm.

The passivation layer 21 is made of a transparent dielectric. The transparent dielectric does not necessarily have the same refractive index as a material forming the second electrode 12. The interface between the second electrode 12 and the passivation layer 21 may function as the second reflection interface 15 using the refractive index difference. As the transparent dielectric, for example, silicon dioxide ($SiO_2$) or silicon nitride (SiN) may be used. The thickness of the passivation layer 21 is, for example, 500 to 10000 nm.

A translucent reflective layer may be provided between the organic layer 13 and the second electrode 12 as necessary. The translucent reflective layer is formed of a metal layer such as, for example, magnesium (Mg), silver (Ag), or an alloy thereof, and the thickness thereof is set to 5 nm or less, and preferably, 3 to 4 nm.

Example 2

Example 2 corresponds to the first embodiment.

Figure 13:
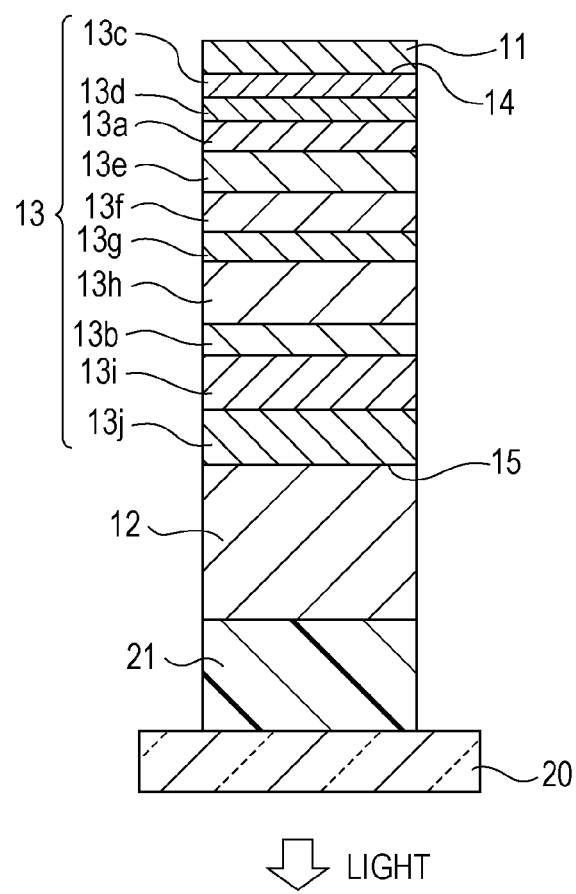
FIG. 13 is a cross-sectional view illustrating a lower surface emission type organic EL element according to Example 2.

FIG. 13 is an organic EL element according to Example 2. The organic EL element is a lower surface emission type organic EL element. As shown in FIG. 13, in the organic EL element, the passivation layer 21, the second electrode 12, the organic layer 13, and the first electrode 11 are sequentially laminated on the substrate 20 from the lower layer. In this case, light output from the second electrode 12 is transmitted through the substrate 20, and is extracted to outside. The remaining parts are the same as in Example 1.

3. Third Embodiment

Organic EL Illumination Device

Figure 14:
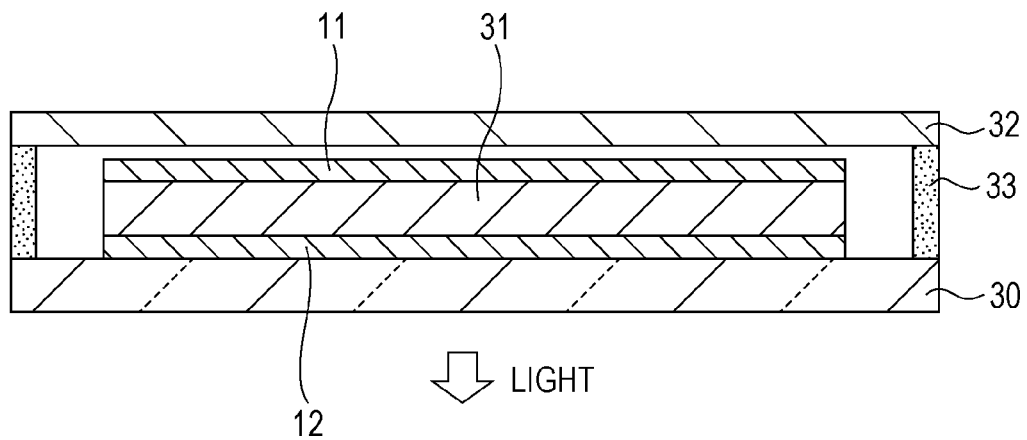
FIG. 14 is a cross-sectional view illustrating an organic EL illumination device according to a third embodiment.

FIG. 14 shows an organic EL illumination device according to the third embodiment.

As shown in FIG. 14, the organic EL element 31 according to any one of the first and second embodiments is mounted on a transparent substrate 30 in the organic EL illumination device. In this case, in the organic EL element 31, the second electrode 12 side is located at the lower part and is mounted on the substrate 30. For this reason, light output from the second electrode 12 side is transmitted through the substrate 30 and is extracted to outside. A sealing substrate 32 is provided so as to be opposite to the substrate 30 with the organic EL element 31 interposed therebetween, and the outer circumferential parts of the sealing substrate 32 and the substrate 30 are sealed with a sealing material 33. A planar shape of the organic EL illumination device is selected as necessary, and is, for example, a square shape or a rectangular shape. Although one organic EL element 31 is shown in FIG. 14, a plurality of organic EL elements 31 may be mounted in a desired arrangement on the substrate 30. Details other than the organic EL element 31 of the organic EL illumination device and configurations other than those described above are the same as in the organic EL illumination device in the related art.

According to the third embodiment, by the use of the organic EL element 31 according to any one of the first and second embodiments, it is possible to implement an organic EL illumination device which has small angle dependency, in other words, becomes a surface light source which has small intensity or color variations due to illumination directions and has favorable light distribution characteristics. In addition, by selecting an emission color of the organic EL element 31 through design of the first emission layer 13a and the second emission layer 13b, it is possible to implement an organic EL illumination device which has an excellent color rendering property since various emission colors can be obtained in addition to the white light emitting.

4. Fourth Embodiment

Organic EL Display Apparatus

Figure 15:
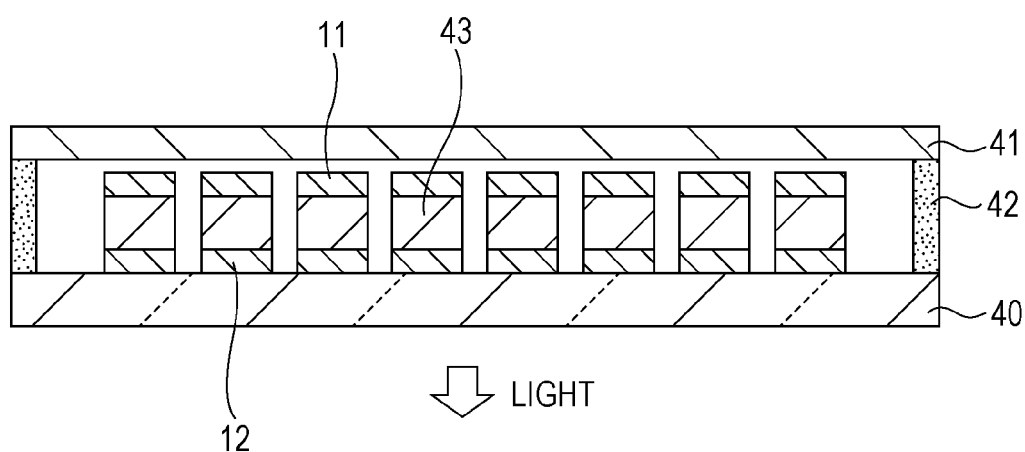
FIG. 15 is a cross-sectional view illustrating an organic EL display apparatus according to a fourth embodiment.

FIG. 15 shows an organic EL display apparatus according to the fourth embodiment. The organic EL display apparatus is of an active matrix type.

As shown in FIG. 15, in the organic EL display apparatus, a driving substrate 40 and a sealing substrate 41 are provided so as to be opposite to each other, and the outer circumferential parts of the driving substrate 40 and the sealing substrate 41 are sealed with a sealing material 42. In the driving substrate 40, pixels including the organic EL element 43 according to any one of the first and the second embodiment are formed in a two-dimensional array shape on, for example, a transparent glass substrate. On the driving substrate 40, a thin film transistor as an active element for pixel driving is formed for each pixel. In addition, on the driving substrate 40, a scanning line, a current supply line, and a data line are formed horizontally and vertically so as to drive the thin film transistor of each pixel. A display signal corresponding to each display pixel is supplied to the thin film transistor of each pixel, and the pixel is driven according to the display signal, thereby displaying images. Details other than the organic EL element 43 of the organic EL display apparatus and configurations other than those described above are the same as in the organic EL display apparatus in the related art.

The organic EL display apparatus may be used as not only a monochrome display apparatus but also a color display apparatus. In a case where the organic EL display apparatus is used as a color display apparatus, RGB color filters are provided on the driving substrate 40 side, specifically, for example, between the second electrode 12 of the organic EL element 43 and the driving substrate 40.

According to the fourth embodiment, by the use of the organic EL element 43 according to any one of the first and second embodiment, it is possible to implement a high image quality organic EL display apparatus where luminance and colors are hardly varied due to the viewing angle.

Although the embodiments and Examples have been described in detail as above, the present disclosure is not limited to the above-described embodiments and Examples and may be variously modified.

For example, the numerical values, structures, configurations, shapes, materials, and the like shown in the above-described embodiments and Examples are only an example, and numerical values, structures, configurations, shapes, materials, and the like different therefrom may be used as necessary.

The present disclosure contains subject matter related to that disclosed in Japanese Priority Patent Application JP 2011-069585 filed in the Japan Patent Office on Mar. 28, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting element comprising: an organic layer that sequentially includes a first emission layer and a second emission layer which are interposed between a first electrode and a second electrode, and emit light of a single color or two or more different colors, at positions spaced apart from each other in the direction of the second electrode from the first electrode;

a first reflection interface that is provided on the first electrode side, and reflects light emitted from the first emission layer and the second emission layer so as to be output from the second electrode side; and a second reflection interface that is provided on the second electrode side, wherein, when an optical distance between the first reflection interface and an emission center of the first emission layer is L11, an optical distance between the first reflection interface and an emission center of the second emission layer is L21, an optical distance between the emission center of the first emission layer and the second reflection interface is L12, an optical distance between the emission center of the second emission layer and the second reflection interface is L22, a central wavelength of an emission spectrum of the first emission layer is $\lambda 1$, and a central wavelength of an emission spectrum of the second emission layer is $\lambda 2$, the optical distances L11, L21, L12 and L22 satisfy all the following expressions (1) to (8).

$$2L11/\lambda 11 + \phi 1/2\pi = 0 \quad (1)$$

$$2L21/\lambda 21 + \phi 1/2\pi = n \text{ (where } n \geq 1\text{)} \quad (2)$$

$$\lambda 1 < \lambda 11 < \lambda 1 + 200 \quad (3)$$

$$\lambda 2 - 40 < \lambda 21 < \lambda 2 + 40 \quad (4)$$

$$2L12/\lambda 12 + \phi 2/2\pi = m' \quad (5)$$

$$2L22/\lambda 22 + \phi 2/2\pi = n' + 1/2 \quad (6)$$

$$\lambda 1 - 100 < \lambda 12 < \lambda 1 \quad (7)$$

$$\lambda 2 - 15 < \lambda 22 < \lambda 2 + 15 \quad (8)$$

where n, m' and n' are integers, the unit of each of $\lambda 1$, $\lambda 2$, $\lambda 11$, $\lambda 21$, $\lambda 12$, and $\mu 22$ is nm, $\phi 1$ indicates a phase variation when light of each wavelength is reflected by the first reflection interface, and $\phi 2$ indicates a phase variation when light of each wavelength is reflected by the second reflection interface.

2. The light emitting element according to claim 1, wherein a peak of a spectral transmittance curve of an interference filter of the light emitting element is substantially flat.

3. The light emitting element according to claim 2, wherein a decrease in luminance when a viewing angle is 45 degrees is 30% or less of luminance when the viewing angle is 0 degrees, and chromaticity shift is $\Delta uv \leq 0.015$.

4. The light emitting element according to claim 3, wherein n=1.

5. The light emitting element according to claim 1, wherein the first electrode, the organic layer, and the second electrode are sequentially laminated on a substrate.

6. The light emitting element according to claim 5, wherein an outside of the second reflection interface is formed by a transparent electrode layer, a transparent insulating layer, a resin layer, a glass layer, or an air layer, which has a thickness of 1 μm or more.

7. The light emitting element according to claim 1, wherein the second electrode, the organic layer, and the first electrode are sequentially laminated on a substrate.

8. The light emitting element according to claim 7, wherein an outside of the second reflection interface is formed by a transparent electrode layer, a transparent insulating layer, a resin layer, a glass layer, or an air layer, which has a thickness of 1 μm or more.

9. The light emitting element according to claim 1, wherein at least one of the first reflection interface and the second reflection interface is divided into a plurality of reflection interfaces.

10. The light emitting element according to claim 1, further comprising a reflective layer that is used to maintain the flatness of the peak of the spectral transmittance curve of the interference filter of the light emitting element in a case where the emission centers of the emission layers emitting light of different colors are not considered to be the same as each other in the first emission layer and the second emission layer.

11. An illumination device comprising at least a light emitting element that includes: an organic layer that sequentially includes a first emission layer and a second emission layer which are interposed between a first electrode and a second electrode, and emit light of a single color or two or more different colors, at positions spaced apart from each other in the direction of the second electrode from the first electrode;

a first reflection interface that is provided on the first electrode side, and reflects light emitted from the first emission layer and the second emission layer so as to be output from the second electrode side; and a second reflection interface that is provided on the second electrode side, wherein, when an optical distance between the first reflection interface and an emission center of the first emission layer is L11, an optical distance between the first reflection interface and an emission center of the second emission layer is L21, an optical distance between the emission center of the first emission layer and the second reflection interface is L12, an optical distance between the emission center of the second emission layer and the second reflection interface is L22, a central wavelength of an emission spectrum of the first emission layer is λ1, and a central wavelength of an emission spectrum of the second emission layer is λ2, the optical distances L11, L21, L12 and L22 satisfy all the following expressions (1) to (8).

$$2L11/\lambda 11 + \phi 1/2\pi = 0 \quad (1)$$

$$2L21/\lambda 21 + \phi 1/2\pi = n \text{ (where } n \geq 1) \quad (2)$$

$$\lambda 1 < \lambda 11 < \lambda 1 + 200 \quad (3)$$

$$\lambda 2 - 40 < \lambda 21 < \lambda 2 + 40 \quad (4)$$

$$2L12/\lambda 12 + \phi 2/2\pi = m' \quad (5)$$

$$2L22/\lambda 22 + \phi 2/2\pi = n' + 1/2 \quad (6)$$

$$\lambda 1 - 100 < \lambda 12 < \lambda 1 \quad (7)$$

$$\lambda 2 - 15 < \lambda 22 < \lambda 2 + 15 \quad (8)$$

where n, m' and n' are integers, the unit of each of λ1, λ2, λ11, λ21, λ12, and λ22 is nm, φ1 indicates a phase variation when light of each wavelength is reflected by the first reflection interface, and φ2 indicates a phase variation when light of each wavelength is reflected by the second reflection interface.

12. A display apparatus comprising at least a light emitting element that includes: an organic layer that sequentially includes a first emission layer and a second emission layer which are interposed between a first electrode and a second electrode, and emit light of a single color or two or more different colors, at positions spaced apart from each other in the direction of the second electrode from the first electrode; a first reflection interface that is provided on the first electrode side, and reflects light emitted from the first emission layer and the second emission layer so as to be output from the second electrode side; and a second reflection interface that is provided on the second electrode side, wherein, when an optical distance between the first reflection interface and an emission center of the first emission layer is L11, an optical distance between the first reflection interface and an emission center of the second emission layer is L21, an optical distance between the emission center of the first emission layer and the second reflection interface is L12, the emission center of the second emission layer and the second reflection interface is L22, a central wavelength of an emission spectrum of the first emission layer is λ1, and an optical distance between a central wavelength of an emission spectrum of the second emission layer is λ2, the optical distances L11, L21, L12 and L22 satisfy all the following expressions (1) to (8).

$$2L11/\lambda 11 + \phi 1/2\pi = 0 \quad (1)$$

$$2L21/\lambda 21 + \phi 1/2\pi = n \text{ (where } n \geq 1) \quad (2)$$

$$\lambda 1 < \lambda 11 < \lambda 1 + 200 \quad (3)$$

$$\lambda 2 - 40 < \lambda 21 < \lambda 2 + 40 \quad (4)$$

$$2L12/\lambda 12 + \phi 2/2\pi = m' \quad (5)$$

$$2L22/\lambda 22 + \phi 2/2\pi = n' + 1/2 \quad (6)$$

$$\lambda 1 - 100 < \lambda 12 < \lambda 1 \quad (7)$$

$$\lambda 2 - 15 < \lambda 22 < \lambda 2 + 15 \quad (8)$$

where n, m' and n' are integers, the unit of each of λ1, λ2, λ11, λ21, λ12, and λ22 is nm, φ1 indicates a phase variation when light of each wavelength is reflected by the first reflection interface, and φ2 indicates a phase variation when light of each wavelength is reflected by the second reflection interface.

13. The display apparatus according to claim 12, further comprising a driving substrate that is provided with an active element for supplying a display signal corresponding to a display pixel to the light emitting element and a sealing substrate that is provided so as to be opposite to the driving substrate, wherein the light emitting element is disposed between the driving substrate and the sealing substrate.

14. The display apparatus according to claim 13, further comprising a color filter that transmits light output from the second electrode side therethrough and is provided on the substrate of the second electrode side of the light emitting element of the driving substrate and the sealing substrate.

\* \* \* \* \*